United States Patent
Ke et al.

(10) Patent No.: US 11,377,624 B2
(45) Date of Patent: Jul. 5, 2022

(54) CLEANING COMPOSITION FOR POST-ETCH OR POST ASH RESIDUE REMOVAL FROM A SEMICONDUCTOR SUBSTRATE AND CORRESPONDING MANUFACTURING PROCESS

(71) Applicant: BASF SE, Ludwigshafen am Rhein (DE)

(72) Inventors: Jhih Jheng Ke, Taoyuan (TW); Andreas Klipp, Ludwigshafen (DE); Yi Ping Cheng, Taoyuan (TW); Joannes Theodorus Valentinus Hoogboom, Ludwigshafen (DE)

(73) Assignee: BASF SE, Ludwigshafen am Rhein (DE)

( * ) Notice: Subject to any disclaimer, the term of this patent is extended or adjusted under 35 U.S.C. 154(b) by 23 days.

(21) Appl. No.: 16/767,336

(22) PCT Filed: Dec. 5, 2018

(86) PCT No.: PCT/EP2018/083684
§ 371 (c)(1),
(2) Date: May 27, 2020

(87) PCT Pub. No.: WO2019/110681
PCT Pub. Date: Jun. 13, 2019

(65) Prior Publication Data
US 2021/0301221 A1 Sep. 30, 2021

(30) Foreign Application Priority Data

Dec. 8, 2017 (EP) .................................. 17206097

(51) Int. Cl.
*C11D 7/08* (2006.01)
*C11D 3/24* (2006.01)
(Continued)

(52) U.S. Cl.
CPC ............ *C11D 3/245* (2013.01); *C11D 3/0073* (2013.01); *C11D 3/2086* (2013.01); *C11D 3/30* (2013.01);
(Continued)

(58) Field of Classification Search
CPC .................................................. C11D 11/0047
(Continued)

(56) References Cited

U.S. PATENT DOCUMENTS

| 6,696,222 B2 | 2/2004 | Hsue et al. |
| 2005/0014667 A1* | 1/2005 | Aoyama ........... H01L 21/76802 510/175 |

(Continued)

FOREIGN PATENT DOCUMENTS

| WO | WO 2004/100245 A1 | 11/2004 |
| WO | WO 2008/080097 A2 | 7/2008 |

(Continued)

OTHER PUBLICATIONS

International Search Report dated Feb. 4, 2019 in PCT/EP2018/083684 filed on Dec. 5, 2018.

(Continued)

*Primary Examiner* — Gregory E Webb
(74) *Attorney, Agent, or Firm* — Armstrong Teasdale LLP (57) ABSTRACT

A cleaning composition for post-etch or post ash residue removal from a substrate used in semiconductor industry and a corresponding use of said cleaning composition is described. Further described is a process for the manufacture of a semiconductor device from a semiconductor substrate, comprising the step of post-etch or post ash residue removal from a substrate by contacting the substrate with a cleaning composition according to the invention.

15 Claims, 2 Drawing Sheets

(51) Int. Cl.
    *C11D 3/00*     (2006.01)
    *C11D 3/20*     (2006.01)
    *C11D 3/30*     (2006.01)
    *C11D 3/34*     (2006.01)
    *C11D 11/00*     (2006.01)
    *H01L 21/02*     (2006.01)

(52) U.S. Cl.
    CPC ........ *C11D 3/3409* (2013.01); *C11D 11/0047* (2013.01); *H01L 21/02063* (2013.01)

(58) Field of Classification Search
    USPC .......................................................... 510/175
    See application file for complete search history.

(56) References Cited

U.S. PATENT DOCUMENTS

| | | |
|---|---|---|
| 2005/0245409 A1 | 11/2005 | Cernat et al. |
| 2010/0163788 A1* | 7/2010 | Visintin ................. C11D 1/62 252/79.3 |
| 2012/0009788 A1 | 1/2012 | Liu et al. |
| 2012/0052686 A1 | 3/2012 | Liu et al. |
| 2012/0283163 A1 | 11/2012 | Barnes et al. |
| 2014/0109931 A1 | 4/2014 | Lee et al. |
| 2015/0307818 A1* | 10/2015 | Barnes .............. H01L 21/02071 510/175 |
| 2016/0032221 A1 | 2/2016 | Barnes et al. |
| 2019/0194580 A1* | 6/2019 | Kamimura ............. C11D 7/261 |
| 2020/0339523 A1* | 10/2020 | Hoogboom .......... C07D 265/30 |

FOREIGN PATENT DOCUMENTS

| | | |
|---|---|---|
| WO | WO 2012/009639 A2 | 1/2012 |
| WO | WO 2014/197808 A1 | 12/2014 |
| WO | WO 2015/173730 A1 | 11/2015 |

OTHER PUBLICATIONS

U.S. Appl. No. 16/064,918, filed Jun. 21, 2018, US-2018-0371371-A1, BASF SE.

U.S. Appl. No. 16/064,686, filed Jun. 21, 2018, US-2019-0002802-A1, BASF SE.

U.S. Appl. No. 16/307,191, filed Feb. 5, 2018, US-2009-0144781-A1, BASF SE.

U.S. Appl. No. 16/765,371, filed May 19, 2020, Expired, BASF SE.

* cited by examiner

CLEANING COMPOSITION FOR POST-ETCH OR POST ASH RESIDUE REMOVAL FROM A SEMICONDUCTOR SUBSTRATE AND CORRESPONDING MANUFACTURING PROCESS

The present invention relates to a cleaning composition for post-etch or post ash residue removal from a substrate used in semiconductor industry and to a corresponding use of said cleaning composition. The present invention further relates to a process for the manufacture of a semiconductor device from a semiconductor substrate, comprising the step of post-etch or post ash residue removal from a substrate by contacting the substrate with a cleaning composition according to the invention.

Processes for manufacturing semiconductor devices are multiple-step sequences of photolithographic and chemical processing steps during which electronic circuits are gradually created on a wafer made of pure semiconducting material (a "semiconductor wafer"). Preferably, silicon is used as the semiconductor material. A typical semiconductor wafer is made out of extremely pure silicon that is grown into mono-crystalline cylindrical ingots (boules) up to 300 mm in diameter using the so-called "Czochralski process". These ingots are then sliced into wafers about 0.75 mm thick and polished to obtain a very regular and flat surface. The particular process for manufacturing semiconductor wafers is structured in several phases, comprising e.g. the so-called "front-end-of-line" ("FEOL") and "back-end-of-line" ("BEOL") processing phases.

The FEOL processing phase refers to the formation of transistors directly in the material (usually the silicon) of the semiconductor wafer. The raw semiconductor wafer is engineered by the growth of an ultrapure, virtually defect-free silicon layer through epitaxy. Front-end surface engineering is followed by growth of the gate dielectric (usually silicon dioxide), patterning of the gate, patterning of the source and drain regions, and subsequent implantation or diffusion of dopants into the semiconducting material to obtain the desired complementary electrical properties.

Once the various devices (e.g. dynamic random access memories, DRAMs; static random access memories, SRAMs; electrically programmable read only memories, EPROMs; or complementary metal on silicon, CMOS) have been created in FEOL processing, they must be interconnected to form the desired electrical circuits. This occurs in a series of wafer processing steps collectively referred to as BEOL. The BEOL processing phase involves creating metal interconnecting wires on the semiconductor wafer's surface that are isolated by layers made of material with low dielectric constant.

With the introduction of copper as electrically conductive material, replacing aluminium, sophisticated multiple-step manufacturing processes for forming integrated circuit interconnects on semiconductor substrates have been developed. A typical process in manufacturing the semiconductor integrated circuit requires hundreds of steps. These steps include several kinds of stages such as diffusion, lithography, etching, ion implantation, deposition and sputtering. In these kinds of stages, diffusion and implantation generally require longer processing time than other process stages which may require less processing time. In addition, some processes, e.g., those with longer processing time, can be simultaneously performed on several semiconductor wafer lots (commonly referred to as a "batch"). In a semiconductor wafer's processing line, several lots (and/or batches) and many kinds of products are put into the processing line continuously at the same time. Thus, many kinds of products are operated on during different kinds of stages in the processing flow. But since the processing time of each product is different from each other, determining how many and which semiconductor wafers to be dispatched into a stage of the processing flow is a logistic challenge. As another consideration, some processes must be performed within a certain amount of time after other processes. For example, after a deposition step a semiconductor wafer can be exposed to air for only a limited amount of time before the quality of the deposited film will begin to degrade. The time between processes is often referred to as the "queue time". Limits on this time are often referred to as "queue time constraints".

One particular multiple-step manufacturing process for forming integrated circuit interconnects on semiconductor substrates is known as damascene process with its variants like the dual damascene process, including the TFVL ("trench-first-via-last") dual damascene process, the VFTL ("via-first-trench-last") dual damascene process, the self-aligned dual damascene process or the dual damascene patterning process with etch mask, e.g. with metal hard mask (for the latter see e.g. document U.S. Pat. No. 6,696,222). In the damascene processing technology, the desired integrated circuit interconnect structure is patterned by etching the shape of the structure into the underlying inter-layer dielectric ("ILD") materials. After the patterning, typically a thin barrier layer (e.g. made of Ta/TaN, TiN, CoWP, NiMoP, NiMoB) is deposited on top of the etched structure, e.g. as copper diffusion barrier. On top of that barrier layer a seed layer is often deposited which supports better adhesion of the copper on the underlying material and acts as catalytic material during the plating process as well. Typical materials for these seed layers are compounds which include Pd or other compounds, e.g. of polymers and organic materials. The original deposition process (damascene process) was designed to process each layer on its own.

Hence, the so called "vertical interconnect accesses" ("Vias"), the electrically conductive interconnects usually comprising or consisting of copper, and the overlying metallization levels have different process steps and demand a sequence of cleaning, material deposition, chemical-mechanical polishing ("CMP"), and another cleaning step for each layer. A copper technology using this sequence for its metallization levels as well as for its ILDs and inter via dielectrics ("IVD"s) is often called a "single damascene process". Typically, in the single damascene process each level requires its own cap layer or etch stop layer, a separate ILD layer, and at the top there is a need for a material—for instance $SiO_2$— that can be polished together with the interconnect metal copper. As an alternative to the single damascene process, the "dual damascene" processing technology combines certain similar process steps to one single process step, thus reducing the number of process steps and the time and costs required to build the BEOL stack of different layers. Accordingly, the dual damascene process fabricates the IVD and the metallization layer at once.

Multiple-step manufacturing processes for forming integrated circuit interconnects on semiconductor substrates like the damascene manufacturing process or its variants thus usually comprise one or more process steps which require an "opening" of the Vias, usually by applying a dry etching technology like reactive ion etching ("RIE") or plasma etching (also known as chemical dry etching), which involve reactive etching gases promoted with plasma energy.

Such Via-opening process steps usually comprise etching of one or more different (consecutive) layers situated above the Vias, which layers may comprise electrically conductive, electrically semi-conductive and/or insulating materials. Examples of such different (consecutive) layers are photoresist layers, bottom anti-reflective coating (BARC) layers, etch mask layers (e.g. metal hard mask layers, preferably comprising TiN, or polymer mask layers), ILD layers (e.g. comprising $SiO_2$ or silicon oxynitride) or low k material layers. Etching of said different layers is usually performed selectively (often by applying one or more etch mask layers to protect areas of a layer which should not be etched in a particular etching step) over a part of their horizontal extensions to create defined openings for accessing certain areas of one or more subjacent layers, until a defined segment of the Via is reached at the bottom of the stack of layers.

Said etching processes produce residues from the interaction of the reactive plasma gases used in the etching process and the materials they interact with. The composition of said residues is influenced by the type of etching applied, the material of the layer etched (e.g. the resist), any underlying substrates and the process conditions applied. If the etching residues are not removed from the substrate, they can interfere with subsequent processes involving the substrate. Such removal of or cleaning from etching residues is often referred to as "post-etch residue" removal or as "post-ash residue" removal. The effect of poor removal or cleaning can result in low yield, low reliability and/or low performance of an affected semiconductor device. Types of residues that should be removed often comprise organic compounds like organic polymers which may or may not comprise fluorine, metal-organic complexes, e.g. complexes of Ti (like fluorine complexes of Ti, also referred to as "$TiF_x$", or oxygen complexes of Ti, also referred to as "$TiO_x$") and/or Cu (like fluorine complexes of Cu, also referred to as "$CuF_x$", or oxygen complexes of Cu, also referred to as "$CuO_x$", or Cu hydroxide compounds, also referred to as $Cu(OH)_x$, in particular $Cu(OH)_2$) and/or residues comprising metallic materials, e.g. Al, AlCu (i.e. an alloy of Al and Cu), $HfO_x$ (i.e. hafnium oxide) Ta, TaN, Ti and/or TiN. Inappropriate cleaning can also lead to unsatisfactory short times during which a semiconductor wafer's surface during processing can be exposed to air without experiencing degradation of quality of the deposited film, resulting in queue time constraints and thus in a limitation of process flexibility. As another example, poor removal of copper-containing residues like $CuO_x$ compounds or $Cu(OH)_x$ compounds can lead to impaired electrical contacts in the Vias.

In summary, cleaning compositions for post-etch or post ash residue removal ("post ash residue removal" also abbreviated to "PARR" in this text) should preferably remove, to the highest extent possible, undesired residues from (previous) processing steps in a multiple-step manufacturing process for forming integrated circuit interconnects on semiconductor substrates, while at the same time not or only to the least possible extent compromising or damaging desired materials which are also present on the semiconductor substrate's surface, like certain dielectric materials, e.g. low k material, and/or metallic interconnect materials, in particular copper.

The ongoing development in manufacturing processes for forming integrated circuit interconnects on semiconductor substrates (e.g. shrinking device dimensions, changes in etching conditions) and the ongoing integration of new materials in said processes demand specialized cleaning compositions to meet these changing requirements. The prior art also reflects this versatility of requirements and how they have been addressed in the past.

For example, document WO 2004/100245 pertains to the removal of post-etch residues in semiconductor processing.

Document WO 2008/080097 describes a liquid cleaner for the removal of post-etch residues.

Document WO 2012/009639 pertains to an aqueous cleaner for the removal of post-etch residues.

Document US 2012/0009788 describes a cleaning solution, cleaning method and damascene process using the same.

Document US 2012/0052686 pertains to a cleaning solution and damascene process using the same.

Document WO 2014/197808 pertains to compositions and methods for selectively etching titanium nitride.

Document WO 2015/173730 describes a TiN pull-back and cleaning composition.

In view of the prior art there is still a need for a cleaning composition for post-etch or post ash residue removal from a substrate used in semiconductor industry which can satisfactorily remove residues from one or more different layers (i.e. from layers which have been etched before) selected from photoresist layers, bottom antireflective coating layers, etch mask layers, ILD layers and low k material layers, while at the same time not or to the least extent possible compromising or damaging low k materials and/or metallic interconnect materials, in particular copper, which are also present.

It was therefore a primary object of the present invention to provide an improved cleaning composition for post-etch or post ash residue removal from a substrate used in semiconductor industry for removing residues from one or more different layers (which can be present on the substrate at the same time; i.e. from layers which have been etched before) selected from photoresist layers, bottom antireflective coating layers, etch mask layers, ILD layers and low k material layers, while at the same time not or to the least extent possible compromising or damaging low k materials and/or metallic interconnect materials, in particular copper, which are also present on the substrate.

It was a more specific aspect of the primary object of the invention to provide an improved process for the manufacture of a semiconductor device from a semiconductor substrate, the process comprising a step of post-etch or post ash residue removal from a substrate, and in particular further comprising a layer of copper and/or a low k material.

It has now been found that the primary object and other objects of the invention are accomplished by a cleaning composition for post-etch or post ash residue removal from a substrate used in semiconductor industry, comprising (i.e. one or more further substances may be present) or consisting of (i.e. no further substances are present in addition to component A to F as defined hereinafter):

(A) one or more etchants comprising fluoride, preferably selected from the group consisting of ammonium fluoride, ammonium bifluoride, triethanolammonium fluoride, diglycolammonium fluoride, methyldiethanolammonium fluoride, tetramethylammonium fluoride, triethylamine trihydrofluoride, hydrogen fluoride, fluoroboric acid, tetrafluoroboric acid, ammonium tetrafluoroborate, fluoroacetic acid, ammonium fluoroacetate, trifluoroacetic acid, fluorosilicic acid, ammonium fluorosilicate, tetrabutylammonium tetrafluoroborate and mixtures thereof (B) one or more alkanolamines, preferably selected from the group consisting of monoisopropanolamine, diisopropanolamine, triisopropanolamine, 2-(2-aminoethylamino)-ethanol, 2-(2-aminoethoxy)-ethanol, 2-aminoethanol (CAS RN 141-43-5), 2-(N-methylamino)

ethanol, 2-amino-1-propanol, 2-(2-hydroxyethyl-amino)ethanol (CAS RN 111-42-2), 2-[(2-aminoethyl) (2-hydroxyethyl)-amino]-ethanol, tris-(2-hydroxyethyl)amine (CAS RN 102-71-6), N-aminoethyl-N'-hydroxyethylethylenediamine, N,N'-dihydroxyethyl-ethylenediamine, 2-[2-(2-aminoethoxy)ethylamino] ethanol, 2-[2-(2-aminoethylamino)-ethoxy]-ethanol, 2-[2-(2-aminoethoxy)-ethoxy]-ethanol, tertiary-butyldiethanolamine, 3-amino-1-propanol, isobutanolamine, 2-(2-aminoethoxy)-propanol and mixtures thereof;

(C) one or more sulfonic acids, preferably selected from the group consisting of methane sulfonic acid, ethanesulfonic acid, propanesulfonic acid, butanesulfonic acid, hexanesulfonic acid, 3-(N-morpholino)propane sulfonic acid, 2-(N-morpholino)ethanesulfonic acid, N-cyclohexyl-2-aminoethanesulfonic acid, 3-[4-(2-hydroxyethyl)-1-piperazinyl]propanesulfonic acid, N-cyclohexyl-3-aminopropanesulfonic acid and mixtures thereof;

(D) one or more corrosion inhibitors, preferably selected from the group consisting of benzotriazole, 5-methylbenzotriazole, 1,2,4-triazole, 5-aminotetrazole, 1-hydroxybenzotriazole, 5-amino-1,3,4-thiadiazol-2-thiol, 3-amino-1H-1,2,4 triazole, 3,5-diamino-1,2,4-triazole, tolyltriazole, 5-phenyl-benzotriazole, 5-nitro-benzotriazole, 3-amino-5-mercapto-1,2,4-triazole, 1-amino-1,2,4-triazole, 2-(5-amino-pentyl)-benzotriazole, 1-amino-1,2,3-triazole, 1-amino-5-methyl-1,2,3-triazole, 3-mercapto-1,2,4-triazole, 3-isopropyl-1,2,4-triazole, 5-phenylthiol-benzotriazole, halobenzotriazoles where halo is selected from the group consisting of fluorine, chlorine, bromine and iodine; naphthotriazole, 1H-tetrazole-5-acetic acid, 2-mercaptobenzothiazole, 1-phenyl-2-tetrazoline-5-thione, 2-mercaptobenzimidazole, 4-methyl-2-phenylimidazole, 2-mercaptothiazoline, 2,4-diamino-6-methyl-1,3,5-triazine, thiazole, imidazole, benzimidazole, triazine, methyltetrazole, 1,3-dimethyl-2-imidazolidinone, 1,5-pentamethylenetetrazole, 1-phenyl-5-mercaptotetrazole, 2H-imidazole-2-thione, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, 2,2'-azanediyldiacetic acid, propanethiol, ascorbic acid, thiourea, ethylene urea, ethylene thiourea, 1,1,3,3-tetramethylurea, urea, uric acid, glycine, dodecylphosphonic acid, oxalic acid, malonic acid, succinic acid, nitrilotriacetic acid and mixtures thereof;

(E) citric acid, and (F) water.

It was particularly surprising that the cleaning composition according to the invention was suited for removing from a substrate used in semiconductor industry residues from one or more different (consecutive) layers, preferably residues from all different (consecutive) layers, selected from the group consisting of photoresist layer, bottom anti-reflective coating layer, etch mask layer, ILD layer and low k material layer, while at the same time not or to the least extent possible compromising or damaging low k materials and/or metallic interconnect materials, preferably copper, which are also present on the substrate.

It was also particularly surprising that the cleaning composition of the invention as defined above allows
increased yields of functioning transistors or transistor clusters on fully processed semiconductor wafers (comprising in each case a layer of copper and a low k material): i.e. a yield increase of about 1.9% in functioning transistors or transistor clusters is observed on a series of semiconductor wafers after their full processing which processing comprised a step of post-etch and/or post ash residue removal from the surfaces of said series of semiconductor wafers with a composition according to the present invention at 45° C. for 60 s, when compared with the respective yield observed on an equivalent series of semiconductor wafers after their full processing, which processing instead comprised a step of post-etch and/or post ash residue removal from the surfaces of the equivalent series of semiconductor wafers with an existing composition from the prior art designed for a similar purpose of removing post-etch or post ash residue from the surface of a semiconductor substrate, and/or simplified manufacturing processes by reducing the number of process steps, in particular the number of rinsing steps, required for manufacturing a semiconductor device.

The invention as well as preferred embodiments and preferred combinations of parameters, properties and elements thereof are defined in the appended claims. Preferred aspects, details, modifications and advantages of the present invention are also defined and explained in the following description and in the examples stated below.

In the context of the present invention, a "photoresist layer" means—consistent with the usual meaning in the technical field of microelectronics or microlithography—a layer or film which, when exposed to light with a wavelength in the range of from 250 to 400 nm, the portion of the photoresist that was exposed to said light either becomes (i) soluble to a specific developer ("positive photoresist") while the unexposed portion of the photoresist remains insoluble to the photoresist developer, or the portion of the photoresist that was exposed to said light becomes (ii) insoluble to a specific developer ("negative photoresist") while the unexposed portion of the photoresist remains soluble to the photoresist developer. The term "photoresist" in the context of the present invention comprises photopolymeric photoresists, photodecomposable photoresists and photocrosslinking photoresists.

In the context of the present invention, a "bottom anti-reflective coating" ("BARC") or bottom resist anti-reflective coating means—consistent with the usual meaning in the technical field of microelectronics or microlithography—an organic or silico-organic polymer used to improve the profile of a photoresist and the overall process operating window. BARCs are applied prior to the photoresist to help eliminate standing waves and the resulting defective/sloped resist sidewalls, which can commonly occur in imaged nanostructures due to varying and reflected light intensities throughout the resist thickness. BARCS have to be selected based on the specific wavelength processes including i-Line, 248 nm, 193 nm (dry and immersion). They also have to be compatible with the applied photoresist. BARCs are applied to a semiconductor substrate from organic polymer formulations using a spin-on process and are then heated ("baked", "cured") to a recommended temperature.

In the context of the present invention an "etch mask" means—consistent with the usual meaning in the technical field of microelectronics or microlithography—a layer of a material that can withstand certain etching process steps undamaged and therefore serves as a protecting layer for certain areas of subjacent material layers which should not be etched in a certain etching step. In the context of the present invention, an etch mask layer preferably comprises or consists of (a) a metallic material, preferably selected from the group consisting of Ti, TiN, La, LaN, HfO$_x$ (i.e. hafnium oxide), Al, AlCu, or (b) an organic polymeric material. An etch mask can also be a photoresist.

In the context of the present invention an "ILD" means—consistent with the usual meaning in the technical field of microelectronics or microlithography—a dielectric material used to electrically separate closely spaced interconnect lines arranged in several levels (multilevel metallization) in an integrated circuit. An ILD usually has a dielectric constant k≤3.9 to minimize capacitive coupling between adjacent metal lines, e.g. Vias. In the context of the present invention, an ILDs preferably comprises or consists of $SiO_2$ and/or silicon oxynitride.

In the context of the present invention a "low k material" means—consistent with the usual meaning in the technical field of microelectronics or microlithography—a material with a dielectric constant κ<3.9 which is preferably selected from the group consisting of silicon-containing materials, preferably selected from the group consisting of $SiO_2$, silicon oxycarbide (SiOC), tetraethylorthosilicate (TEOS), boron-doped phosphosilicate glass (BPSG), fluorine-doped silicon dioxide (fluorosilicate glass, FSG), carbon-doped silicon dioxide, organo silicate glass (OSG), carbon-doped oxide (CDO), porous silicon dioxide, porous carbon-doped silicon dioxide (e.g. known as Black Diamond™ II) and spin-on silicon polymeric materials, preferably selected from the group consisting of hydrogen silsesquioxane (HSQ) and methylsilsesquioxane (MSQ); and polymeric materials, preferably selected from the group consisting of spin-on organic polymeric dielectrics, preferably comprising polyimide (PI), polynorbornenes, benzocyclobutene and polytetrafluorethylene (PTFE).

In the context of the present invention a "metallic interconnect material" means—consistent with the usual meaning in the technical field of microelectronics or microlithography—a material selected from the group consisting of aluminium, cobalt, copper, ruthenium, titanium and tungsten. In the context of the present invention copper is preferred as a metallic interconnect material.

In the context of the present invention a "substrate used in semiconductor industry" or a "semiconductor substrate" preferably mean—consistent with the usual meaning in the technical field of microelectronics or microlithography—a semiconductor wafer.

In the cleaning composition according to the invention as defined above, the one or more etchants comprising fluoride anions (A), the one or more alkanolamines (B), the one or more sulfonic acids (C) and the one or more corrosion inhibitors (D) generally can in each case be used alone (as one single compound) or can be used in combination with other compounds from the same type (etchant, alkanolamines, sulfonic acids or corrosion inhibitor, respectively, as applicable).

In component (A) of the composition according to the invention, the one or more etchants comprising fluoride can comprise one or more fluoride anions or provide one or more fluoride anions upon contact with water.

Preferred is therefore a cleaning composition according to the invention as defined herein, wherein the one or more etchants comprising fluoride (A) are selected from the group consisting of ammonium fluoride, ammonium bifluoride, triethanolammonium fluoride, diglycolammonium fluoride, methyldiethanolammonium fluoride, tetramethylammonium fluoride, triethylamine trihydrofluoride, hydrogen fluoride, fluoroboric acid, tetrafluoroboric acid, ammonium tetrafluoroborate, fluoroacetic acid, ammonium fluoroacetate, trifluoroacetic acid, fluorosilicic acid, ammonium fluorosilicate, tetrabutylammonium tetrafluoroborate and mixtures thereof, and preferably the or at least one etchant comprising fluoride (A) is ammonium fluoride, and more preferably the etchant (A) is ammonium fluoride, and/or the total amount of the one or more etchants comprising fluoride (A), preferably ammonium fluoride, is in the range of from 0.001 to 1 wt.-%, preferably in the range of from 0.01 to 0.1 wt.-%, based on the total weight of the cleaning composition.

A cleaning composition according to the invention which has such a relatively low content of one or more etchants comprising fluoride as defined here above, preferably such a relatively low content of ammonium fluoride (in particular where ammonium fluoride is the sole etchant present in the cleaning composition according to the invention) has the advantages of better compatibility with low k materials (i.e. such cleaning composition causes less damage to low k materials or low k material layers than a similar cleaning composition with a higher content of etchant, in particular of ammonium fluoride) and of producing less residual material, e.g. fluorine-containing etchants, which may need special treatment or deposit in order to dispose of it in an environmentally safe manner.

Also preferred is a cleaning composition according to the invention as defined herein (or a cleaning composition according to the invention as described above or below as being preferred), comprising or consisting of (A) one or more etchants comprising fluoride, selected from the group consisting of ammonium fluoride, ammonium bifluoride, triethanolammonium fluoride, diglycolammonium fluoride, methyldiethanolammonium fluoride, tetramethylammonium fluoride, triethylamine trihydrofluoride, hydrogen fluoride, fluoroboric acid, tetrafluoroboric acid, ammonium tetrafluoroborate, fluoroacetic acid, ammonium fluoroacetate, trifluoroacetic acid, fluorosilicic acid, ammonium fluorosilicate, tetrabutylammonium tetrafluoroborate and mixtures thereof, preferably in a total amount in the range of from 0.001 to 1 wt.-%, more preferably in the range of from 0.01 to 0.1 wt.-%, based on the total weight of the cleaning composition;

(B) one or more alkanolamines selected from the group consisting of monoisopropanolamine, diisopropanolamine, triisopropanolamine, 2-(2-aminoethylamino) ethanol, 2-(2-aminoethoxy)-ethanol, 2-aminoethanol (CAS RN 141-43-5), 2-(N-methylamino) ethanol, 2-amino-1-propanol, 2-(2-hydroxyethylamino)ethanol (CAS RN 111-42-2), 2-[(2-aminoethyl)(2-hydroxyethyl)-amino]-ethanol, tris-(2-hydroxyethyl)amine (CAS RN 102-71-6), N-aminoethyl-N'-hydroxyethylethylenediamine, N,N'-dihydroxyethyl-ethylenediamine, 2-[2-(2-aminoethoxy)ethylamino]ethanol, 2-[2-(2-aminoethylamino)-ethoxy]-ethanol, 2-[2-(2-aminoethoxy)-ethoxy]-ethanol, tertiary-butyldiethanolamine, 3-amino-1-propanol, isobutanolamine, 2-(2-aminoethoxy)-propanol and mixtures thereof, preferably in a total amount in the range of from 10 to 20 wt.-%, more preferably in the range of from 12 to 17 wt.-%, based on the total weight of the cleaning composition;

(C) one or more sulfonic acids selected from the group consisting of methane sulfonic acid, ethanesulfonic acid, propanesulfonic acid, butanesulfonic acid, hexanesulfonic acid), 3-(N-morpholino)propane sulfonic acid, 2-(N-morpholino)ethanesulfonic acid, N-cyclohexyl-2-aminoethanesulfonic acid, 3-[4-(2-hydroxyethyl)-1-piperazinyl]propanesulfonic acid, N-cyclohexyl-3-aminopropanesulfonic acid and mixtures thereof, preferably in a total amount in the range of from 0.01 to 10 wt.-%, more preferably of from 0.1 to 1 wt.-%, based on the total weight of the cleaning composition;

(D) one or more corrosion inhibitors selected from the group consisting of benzotriazole, 5-methyl-benzotriazole, 1,2,4-triazole, 5-aminotetrazole, 1-hydroxybenzotriazole, 5-amino-1,3,4-thiadiazol-2-thiol, 3-amino-1H-1,2,4 triazole, 3,5-diamino-1,2,4-triazole, tolyltriazole, 5-phenyl-benzotriazole, 5-nitro-benzotriazole, 3-amino-5-mercapto-1,2,4-triazole, 1-amino-1,2,4-triazole, 2-(5-aminopentyl)benzotriazole, 1-amino-1,2,3-triazole, 1-amino-5-methyl-1,2,3-triazole, 3-mercapto-1,2,4-triazole, 3-isopropyl-1,2,4-triazole, 5-phenylthiol-benzotriazole, halobenzotriazoles where halo is selected from the group consisting of fluorine, chlorine, bromine and iodine; naphthotriazole, 1H-tetrazole-5-acetic acid, 2-mercaptobenzothiazole, 1-phenyl-2-tetrazoline-5-thione, 2-mercaptobenzimidazole, 4-methyl-2-phenylimidazole, 2-mercaptothiazoline, 2,4-diamino-6-methyl-1,3,5-triazine, thiazole, imidazole, benzimidazole, triazine, methyltetrazole, 1,3-dimethyl-2-imidazolidinone, 1,5-pentamethylenetetrazole, 1-phenyl-5-mercaptotetrazole, 2H-imidazole-2-thione, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, 2,2'-azanediyldiacetic acid, propanethiol, ascorbic acid, thiourea, ethylene urea, ethylene thiourea, 1,1,3,3-tetramethylurea, urea, uric acid, glycine, dodecylphosphonic acid, oxalic acid, malonic acid, succinic acid, nitrilotriacetic acid and mixtures thereof,
preferably in a total amount in the range of from 0.001 to 10 wt.-%, more preferably of from 0.01 to 1 wt.-%, based on the total weight of the cleaning composition;

(E) citric acid,
preferably in a total amount in the range of from 0.1 to 25 wt.-%, more preferably in the range of from 5 to 25 wt.-%, even more preferably in the range of from 10 to 25 wt.-% and yet even more preferably in the range of from 15 to 25 wt.-%, based on the total weight of the cleaning composition, and (F) water,
preferably as balance to a total of 100 wt.-% of the cleaning composition.

The preferred amounts of components (A) to (F) are preferably present in combination with each other, i.e. preferably all components (A) to (F) are present in the respective preferred amount. This statement generally applies for preferred amounts indicated in the present text, mutatis mutandis.

A cleaning composition according to the invention as defined herein (or a cleaning composition according to the invention as described above or below as being preferred) is also preferred wherein
the or at least one alkanolamine (B) is tris-(2-hydroxyethyl)-amine (also known as triethanolamine), preferably the alkanolamine (B) is tris-(2-hydroxyethyl) amine,
and/or
the total amount of the one or more alkanolamines (B), preferably tris-(2-hydroxyethyl)-amine, is in the range of from 10 to 20 wt.-%, preferably in the range of from 12 to 17 wt.-%, based on the total weight of the cleaning composition.

It has been found that tris-(2-hydroxyethyl)-amine as alkanolamine (B) in the compositions of the present invention assists particularly efficiently in removing organic polymer residues from a substrate used in semiconductor industry.

A cleaning composition according to the invention as defined herein (or a cleaning composition according to the invention as described above or below as being preferred) is also preferred wherein
the or at least one sulfonic acid (C) is methane sulfonic acid, preferably the sulfonic acid (C) is methane sulfonic acid,
and/or
the total amount of the one or more sulfonic acids (C), preferably methane sulfonic acid, is in the range of from 0.01 to 10 wt.-%, preferably of from 0.1 to 1 wt.-%, based on the total weight of the cleaning composition.

A cleaning composition of the invention comprising the one or more sulfonic acids (C) as defined above, preferably methane sulfonic acid, more preferably in the total amounts as defined above, has the advantage of exerting its excellent post-etch or post ash residue cleaning performance although comprising only a relatively low content of one or more etchants, preferably of ammonium fluoride, as defined above, when compared to known compositions of the prior art used for similar technical applications, e.g. the composition of the present invention only requires about half the concentration (wt./wt.) or less of one or more etchants, preferably of ammonium fluoride, when compared to known compositions of the prior art used for similar technical applications. Such a relatively lower concentration of one or more etchants, preferably of ammonium fluoride, of the composition according to the present invention further lowers the risk of damaging a low k material which may also be present on a substrate used in semiconductor industry, as explained above. Specifically, such cleaning composition of the present invention exerts such excellent post-etch or post ash residue cleaning performance on a substrate used in semiconductor industry and at the same time does not or only to a very low extent compromise or damage low k materials and/or metallic interconnect materials, in particular copper, which are also present on the substrate.

A cleaning composition according to the invention as defined herein (or a cleaning composition according to the invention as described above or below as being preferred) is also preferred wherein
the or at least one corrosion inhibitor (D) is glycine, preferably the corrosion inhibitor (D) is glycine
and/or
the total amount of the one or more corrosion inhibitors (D), preferably glycine, is in the range of from 0.001 to 10 wt.-%, preferably of from 0.01 to 1 wt.-%, based on the total weight of the cleaning composition.

A cleaning composition of the invention comprising the one or more corrosion inhibitors (D) as defined above, preferably comprising glycine, in particular in the total amounts as defined above, has the advantage of decreasing lateral copper etching defects on a substrate used in semiconductor industry and thus minimizing so-called "smiling-curve" defects which can occur with certain etch processes, in particular when compared with similar cleaning compositions which do not comprise glycine.

Smiling curves are generally generated on a copper substrate when copper surfaces are isotropically or anisotropically etched. One way how a smiling curve defect can be generated is e.g. when the middle of a copper structure is etched quicker than its sidewalls. This results in a depression of the etched structure in its middle, with the sidewalls remaining at e.g. their original height. The resulting etched structure then resembles a smiling mouth. Another way how a smiling curve defect can be generated is e.g. when a copper plug (as part of the surface structure of a semiconductor wafer) is etched somewhat in the middle, but quicker etch occurs at its sidewalls, thus undercutting the structure. Depending on the extent of under-etching, the under-etching would either be classified as isotropic (i.e. high degree of under-etching) anisotropic (i.e. resulting in a circular etch shape), or an intermediate between isotropic and anisotropic etching phenomenons.

A cleaning composition according to the invention as defined herein (or a cleaning composition according to the invention as described above or below as being preferred) is also preferred wherein the total amount of citric acid (E) is in the range of from 0.1 to 25 wt.-%, preferably in the range of from 5 to 25 wt.-%, more preferably in the range of from 10 to 25 wt.-% and yet more preferably in the range of from 15 to 25 wt.-%, based on the total weight of the cleaning composition.

It has surprisingly been found that a cleaning composition of the invention which comprises citric acid, preferably in the total amounts as defined above, has several advantages over similar compositions which do not comprise citric acid or which do comprise other acids than citric acid, e.g. stronger acids (e.g. acids with a pKs value of 3.0 or below) like mineral acids. One such advantage is, that a cleaning composition according to the invention comprising citric acid shows a particularly good or particularly effective removal of copper oxide and/or copper hydroxide compounds (also referred to herein as $CuO_x$ compounds or $Cu(OH)_x$ compounds, respectively). Insufficient removal of copper oxide and/or copper hydroxide compounds from the Vias can result in impaired electrical contacts in the Vias and thus to reduced or impaired performance of an affected semiconductor device. Another advantage is that application of a cleaning composition according to the invention comprising citric acid results in cleaned semiconductor substrates which can be exposed to air for extended periods of time without developing characteristic defects (or only developing such characteristic effects to a lesser extent when compared with similar cleaning compositions which do not comprise citric acid), e.g. associated with poor or inappropriate cleaning results, thus allowing extended queue times (e.g. extended by two times, preferably by five times and more preferably by up to ten times the queue times which are possible when using similar compositions known from the prior art), which increases the overall flexibility of processes for manufacturing e.g. semiconductor wafers or products derived therefrom. Said characteristic defects comprise so-called "ball type" defects, i.e. the formation of ball like structures comprising e.g. $TiO_x$ and/or $TiF_x$ compounds on the processed semiconductor substrate's surface, e.g. in the Vias, which can lead to impaired performance of a resulting semiconductor device.

Application of a cleaning composition according to the invention can therefore help to favourably extend the queue time for certain steps of processing a semiconductor substrate up to a possible queue time of more than 20 hours, compared to less than 5 hours which can be accomplished by application of similar compositions of the prior art which do not comprise citric acid, in particular in the preferred total amounts as defined above for cleaning compositions of the present invention. Yet another such advantage is that a cleaning composition according to the invention comprising citric acid comprises less residual material (e.g. strong and/or corrosive acids) which may need special treatment or deposit in order to dispose of it in an environmentally safe manner, e.g. after its use in the process as described herein.

A cleaning composition according to the invention as defined herein (or a cleaning composition according to the invention as described above or below as being preferred) is also preferred wherein components (A), (B), (C), (D) and (E) are used in the total amounts as defined above, preferably in the total amounts as defined above as being preferred, and water (F) is used as balance to a total of 100 wt.-% of the cleaning composition in each case.

A cleaning composition according to the invention as defined herein (or a cleaning composition according to the invention as described above or below as being preferred) is also preferred wherein the above-defined total amounts, preferably the total amounts defined above as being preferred, of components (A), (B), (C), (D), (E) and (F) are combined with the preferred components (A), (B), (C), (D), (E) and (F), as defined above.

Preferred is also a cleaning composition according to the invention as defined herein (or a cleaning composition according to the invention as described above or below as being preferred), comprising or consisting of (A) one or more etchants comprising fluoride, selected from the group consisting of ammonium fluoride, ammonium bifluoride, triethanolammonium fluoride, diglycolammonium fluoride, methyldiethanolammonium fluoride, tetramethylammonium fluoride, triethylamine trihydrofluoride, hydrogen fluoride, fluoroboric acid, tetrafluoroboric acid, ammonium tetrafluoroborate, fluoroacetic acid, ammonium fluoroacetate, trifluoroacetic acid, fluorosilicic acid, ammonium fluorosilicate, tetrabutylammonium tetrafluoroborate and mixtures thereof; preferably the or at least one etchant comprising fluoride is ammonium fluoride, preferably in a total amount in the range of from 0.001 to 1 wt.-%, more preferably in the range of from 0.01 to 0.1 wt.-%, based on the total weight of the cleaning composition;

(B) one or more alkanolamines selected from the group consisting of monoisopropanolamine, diisopropanolamine, triisopropanolamine, 2-(2-aminoethylamino)ethanol, 2-(2-aminoethoxy)-ethanol, 2-aminoethanol (CAS RN 141-43-5), 2-(N-methylamino) ethanol, 2-amino-1-propanol, 2-(2-hydroxyethylamino)ethanol (CAS RN 111-42-2), 2-[(2-aminoethyl)(2-hydroxyethyl)-amino]-ethanol, tris-(2-hydroxyethyl)amine (CAS RN 102-71-6), N-aminoethyl-N'-hydroxyethylethylenediamine, N,N'-dihydroxyethyl-ethylenediamine, 2-[2-(2-aminoethoxy)ethylamino]ethanol, 2-[2-(2-aminoethylamino)-ethoxy]-ethanol, 2-[2-(2-aminoethoxy)-ethoxy]-ethanol, tertiary-butyldiethanolamine, 3-amino-1-propanol, isobutanolamine, 2-(2-aminoethoxy)-propanol and mixtures thereof; preferably the or at least one alkanolamine is tris-(2-hydroxyethyl)-amine, preferably in a total amount in the range of from 10 to 20 wt.-%, more preferably in the range of from 12 to 17 wt.-%, based on the total weight of the cleaning composition;

(C) the or at least one sulfonic acid is methane sulfonic acid, preferably in a total amount in the range of from 0.01 to 10 wt.-%, more preferably of from 0.1 to 1 wt.-%, based on the total weight of the cleaning composition;
(D) the or at least one corrosion inhibitor is glycine, preferably in a total amount in the range of from 0.001 to 10 wt.-%, more preferably of from 0.01 to 1 wt.-%, based on the total weight of the cleaning composition;
(E) citric acid,
preferably in a total amount in the range of from 0.1 to 25 wt.-%, more preferably in the range of from 5 to 25 wt.-%, even more preferably in the range of from 10 to 25 wt.-% and yet even more preferably in the range of from 15 to 25 wt.-%, based on the total weight of the cleaning composition, and
(F) water,
preferably as balance to a total of 100 wt.-% of the cleaning composition,
which preferably has a pH in the range of from 2.5 to 5.5, more preferably in the range of from 3 to 5, still more preferably in the range of from 3.5 to 4.5.

A cleaning composition according to the invention as defined herein (or a cleaning composition according to the invention as described above or below as being preferred) is also particularly preferred, consisting of:
(A) ammonium fluoride, preferably in a total amount in the range of from 0.001 to 1 wt. %, more preferably in the range of from 0.01 to 0.1 wt.-%, based on the total weight of the cleaning composition,
(B) tris-(2-hydroxyethyl)-amine, preferably in a total amount in the range of from 10 to 20 wt.-%, more preferably in the range of from 12 to 17 wt.-%, based on the total weight of the cleaning composition,
(C) methane sulfonic acid, preferably in a total amount of from 0.01 to 10 wt.-%, more preferably in the range of from 0.1 to 1 wt.-%, based on the total weight of the cleaning composition,
(D) glycine, preferably in a total amount in the range of from 0.001 to 10 wt.-%, more preferably in the range of from 0.01 to 1 wt.-%, based on the total weight of the cleaning composition,
(E) citric acid, preferably in a total amount in the range of from 0.1 to 25 wt.-%, more preferably in the range of from 5 to 25 wt.-%, even more preferably in the range of from 10 to 25 wt.-% and yet even more preferably in the range of from 15 to 25 wt. %, based on the total weight of the cleaning composition, and
(F) water, preferably as balance to a total of 100 wt.-% of the cleaning composition in each case,
which preferably has a pH in the range of from 2.5 to 5.5, more preferably in the range of from 3 to 5, still more preferably in the range of from 3.5 to 4.5.

A cleaning composition according to the invention as defined herein (or a cleaning composition according to the invention as described above or below as being preferred) is also preferred for post-etch or post ash residue removal of one or more residues selected from the group comprising or consisting of
organic compounds, preferably organic polymers, comprising or not comprising fluorine,
metal(-organic) complexes and
metallic materials,
from a substrate, wherein a low k material and/or a copper material are part of the substrate.

With regard to a cleaning composition according to the invention as defined herein (or a cleaning composition according to the invention as described above or below as being preferred), metal(-organic) complexes are preferably selected from the group consisting of fluorine complexes of Ti, oxygen complexes of Ti, fluorine complexes of Cu, oxygen complexes of Cu and mixtures thereof; and metallic materials are preferably selected from the group consisting of Ti, TiN, La, LaN, Al, AlCu and mixtures thereof. Metallic materials as defined herein for the purposes of the present invention do not comprise copper metal. A copper material as defined herein is preferably copper metal.

A cleaning composition according to the invention as defined herein (or a cleaning composition according to the invention as described above or below as being preferred) is also preferred which has a pH in the range of from 2.5 to 5.5, preferably in the range of from 3 to 5, more preferably in the range of from 3.5 to 4.5.

A cleaning composition according to the invention as defined herein (or a cleaning composition according to the invention as described above or below as being preferred) is also preferred which has a copper etching rate in the range of from 0.01 to 0.1 nm/min, preferably in the range of from 0.02 to 0.05 nm/min, preferably at a temperature in the range of from 20° C. to 60° C., more preferably in the range of from 30° C. to 50° C., even more preferably in the range of from 35° C. to 45° C. and yet even more preferably in the range of from 35° C. to 42° C.

The present invention also pertains to the use of a cleaning composition according to the invention as defined herein (or to the use of a cleaning composition according to the invention as described above or below as being preferred)
for removing post-etch or post ash residue from the surface of a semiconductor substrate comprising a low k material and/or copper,
wherein the post-etch or post ash residue preferably comprises one or more residues selected from the group comprising or consisting of:
organic compounds, preferably organic polymers, comprising or not comprising fluorine,
metal(-organic) complexes and
metallic materials,
and/or
for cleaning a semiconductor substrate comprising a low k material and/or copper, preferably after a step of etching one or more substrate layers,
wherein the one or more substrate layers (i.e. from layers which have been etched before) are preferably selected from the group consisting of photoresist layer, bottom anti-reflective coating layer, etch mask layer, inter-layer dielectric layer and low k material layer;
and/or
for removing residues and contaminants from the surface of a semiconductor substrate comprising a low k material and/or copper,
wherein the residues and contaminants are preferably selected from the group comprising or consisting of:
organic compounds, preferably organic polymers, comprising or not comprising fluorine
metal(-organic) complexes and
metallic materials.

Generally, all aspects of the present invention discussed herein in the context of the inventive cleaning composition apply mutatis mutandis to the use of said cleaning composition according to the invention, as defined here above and below. And vice versa, all aspects of the present invention discussed herein in the context of the use of said cleaning composition according to the invention apply mutatis mutandis to the inventive cleaning composition.

With regard to the use of a cleaning composition according to the invention as defined above, the terms "photoresist layer", "bottom anti-reflective coating", "etch mask", "inter-layer dielectric" and "low k material" shall have the meanings as defined above.

A use of a cleaning composition according to the invention as defined herein (or of a cleaning composition according to the invention as described above or below as being preferred) is also preferred wherein the use is in a dual damascene process for manufacturing a semiconductor device.

The present invention also pertains to a process for the manufacture of a semiconductor device from a semiconductor substrate, the process comprising a step of post-etch or post ash residue removal from a substrate (preferably a semiconductor substrate) by contacting the substrate at least once with a cleaning composition according to the invention as defined above (or a cleaning composition according to the invention as described above as being preferred).

Generally, all aspects of the present invention discussed herein in the context of the inventive cleaning composition and the inventive use of a cleaning composition apply mutatis mutandis to the process for the manufacture of a semiconductor device comprising a step of post-etch or post ash residue removal from a substrate according to the present invention, as defined here above and below. And vice versa all aspects of the process for the manufacture of a semiconductor device according to the present invention discussed herein apply mutatis mutandis to the inventive cleaning composition and the inventive use of a cleaning composition.

A process comprising a step of post-etch or post ash residue removal from a substrate according to the invention as defined herein (or a process according to the invention as defined herein as being preferred) is also preferred, wherein
the semiconductor substrate comprises a layer of copper and/or an oxide of copper and/or a copper hydroxide compound and/or a low k material, and/or
in the step of post-etch or post ash residue removal, the residue comprises one or more residues selected from the group comprising or consisting of:
organic compounds, preferably organic polymers, comprising or not comprising fluorine,
metal(-organic) complexes and
metallic materials.

A copper hydroxide compound (also referred to as $Cu(OH)_x$) which can be present in this preferred variant of the process according to the invention preferably comprises or consists of $Cu(OH)_2$.

It is a particular achievement of the process comprising a step of post-etch or post ash residue removal from a substrate according to the invention that it allows excellent pos-tetch or post ash residue removal where the post-etch or post ash residues are of various origins (e.g. residues and contaminants from the previous etching of one or more layers on the semiconductor substrate selected from the group consisting of photoresist layer, bottom anti-reflective coating layer, etch mask layer, inter-layer dielectric layer and low k material layer, see above) while at the same time preserving fully or to a very high extent, layers of metallic interconnect material, in particular of copper, and of low k material and/or while particularly effectively removing copper oxide compounds (also referred to as $CuO_x$ compounds) and/or copper hydroxide compounds from the substrate.

A process comprising a step of post-etch or post ash residue removal from a substrate according to the invention as defined herein (or a process according to the invention as defined above as being preferred) is particularly preferred, wherein the process comprises at least one step of etching one or more substrate layers, preferably comprising a step of wet etching or dry etching, wherein:
the step of post-etch or post ash residue removal is performed after said at least one step of etching one or more substrate layers,
and/or (preferably "and")
the step of post-etch or post ash residue removal from a substrate comprises the removal of one or more oxides or hydroxides of copper and/or the removal of organic compounds, preferably organic polymers, comprising or not comprising fluorine.

In the above-defined preferred process, dry etching is preferred and preferably comprises reactive ion etching and plasma etching. Where more than one step of etching one or more substrate layers is carried out in the above-defined preferred process, the or a step of post-etch or post ash residue removal is preferably performed after each of said more than one steps. In the above defined preferred process, hydroxides of copper preferably comprise or consist of $Cu(OH)_2$.

A process comprising a step of post-etch or post ash residue removal from a substrate according to the invention as defined herein (or a process according to the invention as defined herein as being preferred) is also preferred, which is performed at a temperature in the range of from 20° C. to 60° C., more preferably in the range of from 30° C. to 50° C., even more preferably in the range of from 35° C. to 45° C. and yet even more preferably in the range of from 35° C. to 42° C.

In many cases, a process comprising a step of post-etch or post ash residue removal from a substrate according to the invention as defined herein (or a process according to the invention as defined above as being preferred) is also preferred, wherein the one or more substrate layers are selected from the group consisting of photoresist layer; bottom anti-reflective coating layer; etch mask layer, preferably polymer etch mask layer; inter-layer dielectric layer, preferably silicon oxynitride layer and low k material layer, preferably porous silicon dioxide layer and porous carbon-doped silicon dioxide layer.

FIGURES

FIG. 1.

FIG. 2.

FIG. 3.

EXAMPLES

Figure 1:
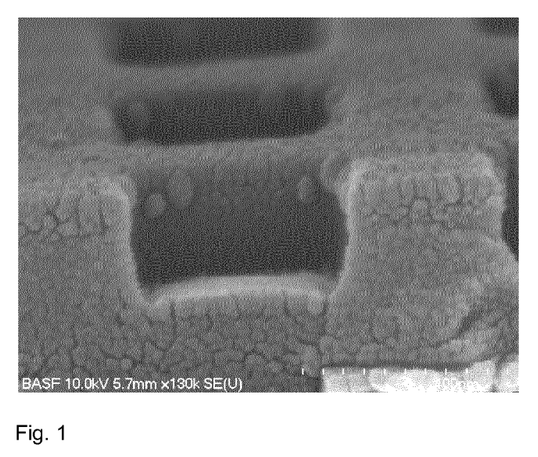
FIG. 1 shows a scanning electron microscope photography (length of picture equivalent to about 880 nm) of a nanometer-scale structure on the surface of a semiconductor wafer after a step of etching and before performing a step of post-etch or post ash residue removal (rinsing) from the surface (at 10 kV: accelerating voltage of the electrons), 5.8 mm (working distance to the substrate)×150 k SE(U)) magnification factor).
Figure 2:
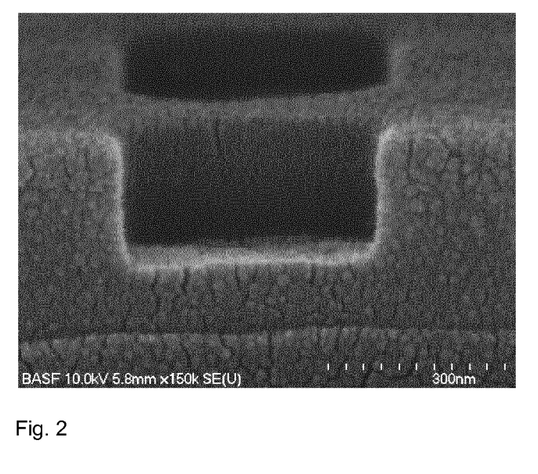
FIG. 2 shows a scanning electron microscope photography (length of picture equivalent to about 750 nm) of the nanometer-scale structure on the surface of a semiconductor wafer shown in FIG. 1, but after performing a step of post-etch or post ash residue removal (rinsing) with a composition 11 (see examples 1 and 2) according to the invention (at 10 kV, 5.8 mm×150 k SE(U)). It can be seen in FIG. 2 that the globular-shaped residues in the depressions on the surface (holes) previously present (see FIG. 1) have been removed, without causing any visible damage to any other part of the surface, as a result of the exposure of the surface of the semiconductor wafer to the composition of the invention.
Figure 3:
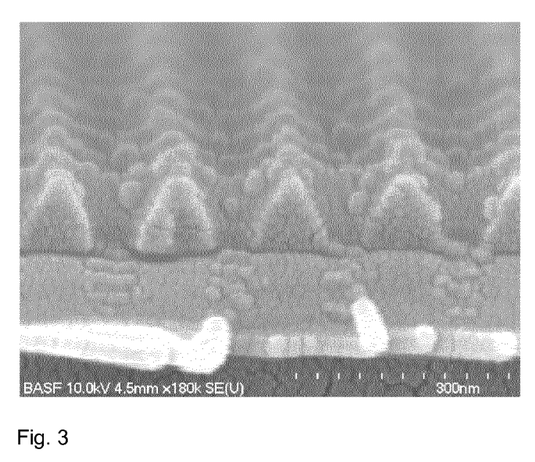
FIG. 3 shows a scanning electron microscope photography (length of picture equivalent to about 880 nm) of another nanometer-scale structure on the surface of a semiconductor wafer after a step of etching and before performing a step of post-etch or post ash residue removal (rinsing) from the surface (at 10 kV, 5.8 mm×150 k SE(U)).
Figure 4:
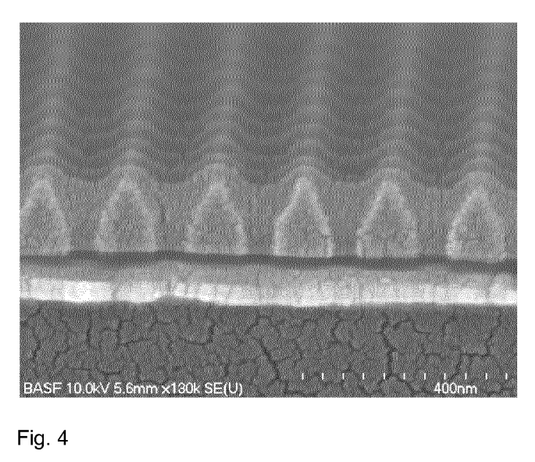
FIG. 4 FIG. 4 shows a scanning electron microscope photography (length of picture equivalent to about 750 nm) of the nanometer-scale structure on the surface of a semiconductor wafer shown in FIG. 3, but after performing a step of post-etch or post ash residue removal (rinsing) with a composition 11 (see examples 1 and 2) according to the invention (at 10 kV, 5.8 mm×150 k SE(U)). It can be seen on the picture that the globular-shaped residues in the depressions on the surface (holes) previously present (see FIG. 3) have been completely removed, without causing any visible damage to any other part of the surface, as a result of the exposure of the surface of the semiconductor wafer to the composition of the invention.

The following examples are meant to further explain and describe the invention without limiting its scope.

Example 1: Preparation of Composition According to the Invention

The following composition according to the invention was prepared by mixing the components (A) to (F) as shown in table 1 below.

TABLE 1

Composition according to the invention

| Component | Constituent | Composition [wt.-%] |
|---|---|---|
| (A) | Ammonium fluoride | 0.01 to 0.1 |
| (B) | Tris-(2-hydroxyethyl)-amine | 12 to 17 |
| (C) | Methane sulfonic acid | 0.1 to 1 |
| (D) | Glycine | 0.01 to 1 |
| (E) | Citric Acid | 15 to 25 |
| (F) | Water (electronic grade) | 55.9 to 72.88 |
|  | pH | 3.5 to 4.5 |

Example 2: Measurement of Copper Etch Rate

The etch rate of the composition of the invention from Example 1 (referred to as "test composition 11" hereinafter) was determined according or analogous to methods described in document WO 2015/173730:

Blanket Si test wafers (with consecutive layers of copper, a low k material and TiN) were selected from appropriate commercial sources and broken into smaller coupons. Then, the initial film or layer thickness of the applicable material was measured (for copper, a 4-point probe was used). The test composition 11 was brought to a temperature in the range of from 35° C. to 45° C. and stirred mechanically. The coupons were fixed to a mechanical holder and, after pre-treatment with oxalic acid, were contacted with the test composition 11 for about 10 minutes in a beaker. Subsequently, the coupons were withdrawn from the test composition and cleaned with ultra-pure water for a period of about 1 minute. Afterwards, the coupons were dried with nitrogen gas. The residual thickness of the copper layer was measured again as described above (4-point probe for copper) and the etch rate was calculated as usual:

For example, when the initial thickness of the copper layer on the blanket test wafer was 33 nm and the thickness of the copper layer on the blanket test wafer after contact with the test composition (see above) was 30 nm, and the reaction time (i.e. contact time of the wafer coupon with the test composition) was 10 min, the copper etch rate was calculated as follows:

$$\text{Copper Etch Rate (hypothetical)}=(33-30)/10\cdot\text{nm/min}=0.3 \text{ nm/min}$$

In a similar experiment, a known cleaning composition for a substrate used in semiconductor industry from the prior art (referred to as "comparative composition C1" hereinafter) was tested which was a solvent-based composition and showed a pH of 8.0.

The results from this test are shown in table 2 below:

TABLE 2

Results from etch rate test

| Parameter | Test Composition I1 | Comparative Composition C1 |
|---|---|---|
| Copper etch rate [nm/min] | 0.02-0.03 | 0.2-0.3 |
| Operating temperature [° C.] | 35-42 | 40 |
| Smile curve defect observed | No | Yes |
| Queue time | >20 hours | <5 hours |

From this test result it can be seen that the cleaning composition of the present invention has a particularly low copper etch rate and is therefore particularly well suited as cleaning composition for a semiconductor substrate which comprises copper, e.g. a layer of copper.

Example 3: Compatibility of Compositions with Several Materials

The compatibility of the compositions according to the invention with typical materials used in the manufacture of semiconductor substrates was tested by measuring etch rates of test composition 11 (see examples 1 and 2) for several substrates in a manner known in the art.

As a result of this test, it was found that test composition 11 showed etch rates of below 0.1 nm/min (equivalent to below 1 Å/min) for the following materials: Tetraethylorthosilicate; fluorinated tetraethylorthosilicate; hafnium oxide; titanium; titanium nitride and tungsten.

Example 4: Yield Increase of Functioning Chips on a Wafer

A step of post-etch and/or post ash residue removal was performed on a series of semiconductor wafers (comprising in each case a layer of copper, an oxide of copper, a copper hydroxide compound and a low k material) in a production environment by exposing the freshly etched patterned surfaces of a first series ("series A") of such semiconductor wafers to composition 11 (see examples 1 and 2) according to the invention, at 45° C. for 60 s (i.e. exposing the surfaces to said composition) and by exposing the freshly etched patterned surfaces of a second series ("series B") of such semiconductor wafers to a comparative composition C1 not according to the invention (see example 3 above), in an equal manner as was done with the semiconductor wafers of series A.

After full processing of the semiconductor wafers of series A and B (the full processing comprising in each case the step of post-etch and/or post ash residue removal as explained above), the yield of functioning transistors or transistor clusters on the finished wafers was measured for both series of semiconductor wafers in a manner known per se.

As a result, it was found that the yield (i.e. the number of functioning transistors or transistor clusters in a series of semiconductor wafers in relation to all transistors or transistor clusters from that series) of the series A of semiconductor wafers which were treated with composition 11 according to the invention was higher than the respective yield of the series B of semiconductor wafers which were treated with comparative composition C1 not according to the invention:

Starting from the yield of functioning transistors or transistor clusters on semiconductor wafers received after exposure of the freshly etched patterned surfaces on semiconductor wafers of series B to comparative composition C1 and taking this yield as "100% yield", the yield of functioning transistors or transistor clusters on semiconductor wafers received after exposure of the freshly etched patterned surfaces on semiconductor wafers of series A to inventive composition 11 was 101.9% when compared to the respective yield of series B.

The invention claimed is:

1. A cleaning composition, comprising:
 (A) one or more etchants comprising fluoride;
 (B) one or more alkanolamines selected from the group consisting of monoisopropanolamine, diisopropanolamine, triisopropanolamine, 2-(2-aminoethylamino)-ethanol, 2-(2-aminoethoxy)-ethanol, 2-aminoethanol, 2-(N-methylamino) ethanol, 2-amino-1-propanol, 2-(2-hydroxyethylamino)ethanol, 2-[(2-aminoethyl)(2-hydroxyethyl)-amino]-ethanol, tris-(2-hydroxyethyl)-amine, N-aminoethyl-N'-hydroxyethylethylenediamine, N,N'-dihydroxyethyl-ethylenediamine, 2-[2-(2-aminoethoxy)-ethylamino]ethanol, 2-[2-(2-aminoethylamino)-ethoxy]-ethanol, 2-[2-(2-aminoethoxy)-ethoxy]-ethanol, tertiary-butyldiethanolamine, 3-amino-1-propanol, isobutanolamine, 2-(2-aminoethoxy)-propanol and mixtures thereof;
 (C) one or more sulfonic acids selected from the group consisting of methane sulfonic acid, ethanesulfonic acid, propanesulfonic acid, butanesulfonic acid, hexanesulfonic acid, 3-(N-morpholino)propane sulfonic acid, 2-(N-morpholino)ethanesulfonic acid, N-cyclohexyl-2-aminoethanesulfonic acid, 3-[4-(2-hydroxyethyl)-1-piperazinyl]propanesulfonic acid, N-cyclohexyl-3-aminopropanesulfonic acid and mixtures thereof;
 (D) one or more corrosion inhibitors selected from the group consisting of benzotriazole, 5-methyl-benzotriazole, 1,2,4-triazole, 5-aminotetrazole, 1-hydroxybenzotriazole, 5-amino-1,3,4-thiadiazol-2-thiol, 3-amino-1H-1,2,4 triazole, 3,5-diamino-1,2,4-triazole, tolyltriazole, 5-phenyl-benzotriazole, 5-nitro-benzotriazole, 3-amino-5-mercapto-1,2,4-triazole, 1-amino-1,2,4-triazole, 2-(5-amino-pentyl)-benzotriazole, 1-amino-1,2,3-triazole, 1-amino-5-methyl-1,2,3-triazole, 3-mercapto-1,2,4-triazole, 3-isopropyl-1,2,4-triazole, 5-phenylthiol-benzotriazole, halobenzotriazoles where halo is selected from the group consisting of fluorine, chlorine, bromine and iodine, naphthotriazole, 1 H-tetrazole-5-acetic acid, 2-mercaptobenzothiazole, 1-phenyl-2-tetrazoline-5-thione, 2-mercaptobenzimidazole, 4-methyl-2-phenylimidazole, 2-mercaptothiazoline, 2,4-diamino-6-methyl-1,3,5-triazine, thiazole, imidazole, benzimidazole, triazine, methyltetrazole, 1,3-dimethyl-2-imidazolidinone, 1,5-pentamethylenetetrazole, 1-phenyl-5-mercaptotetrazole, 2H-imidazole-2-thione, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, 2,2'-azanediyldiacetic acid, propanethiol, ascorbic acid, thiourea, ethylene urea, ethylene thiourea, 1,1,3,3-tetramethylurea, urea, uric acid, glycine, dodecylphosphonic acid, oxalic acid, malonic acid, succinic acid, nitrilotriacetic acid and mixtures thereof,
 wherein at least one corrosion inhibitor (D) is glycine, in a total amount of from 0.01 to 1 wt.-%, based on the total weight of the cleaning composition;
 (E) citric acid in a total amount in the range of from 5 to 25 wt.-%, based on the total weight of the cleaning composition; and
 (F) water.

2. The cleaning composition of claim 1, wherein
 the one or more etchants comprising fluoride (A) are selected from the group consisting of ammonium fluoride, ammonium bifluoride, triethanolammonium fluoride, diglycolammonium fluoride, methyldiethanolammonium fluoride, tetramethylammonium fluoride, triethylamine trihydrofluoride, hydrogen fluoride, fluoroboric acid, tetrafluoroboric acid, ammonium tetrafluoroborate, fluoroacetic acid, ammonium fluoroacetate, trifluoroacetic acid, fluorosilicic acid, ammonium fluorosilicate, tetrabutylammonium tetrafluoroborate and mixtures thereof,
and/or
 a total amount of the one or more etchants comprising fluoride (A) is in a range from 0.001 to 1 wt.-%, based on a total weight of the cleaning composition.

3. The cleaning composition of claim 1, wherein
 one or more alkanolamines (B) is tris-(2-hydroxyethyl)-amine
and/or
 a total amount of the one or more alkanolamines (B) is in a range from 10 to 20 wt.-%, based on a total weight of the cleaning composition.

4. The cleaning composition of claim 1, wherein
 one or more sulfonic acids (C) is methane sulfonic acid
and/or
 a total amount of the one or more sulfonic acids (C) is in a range of from 0.01 to 10 wt.-%, based on a total weight of the cleaning composition.

5. The cleaning composition of claim 1, wherein a total amount of citric acid (E) is in a range from 10 to 25 wt.-%, based on a total weight of the cleaning composition.

6. The cleaning composition of claim 1, comprising:
 (A) one or more etchants comprising fluoride,
 wherein a total amount of the one or more etchants comprising fluoride is (A) in a range of from 0.001 to 1 wt.-%, based on the total weight of the cleaning composition;
 (B) one or more alkanolamines selected from the group consisting of monoisopropanolamine, diisopropanolamine, triisopropanolamine, 2-(2-aminoethylamino)-ethanol, 2-(2-aminoethoxy)-ethanol, 2-aminoethanol, 2-(N-methylamino) ethanol, 2-amino-1-propanol, 2-(2-hydroxyethylamino)ethanol, 2-[(2-aminoethyl)(2-hydroxyethyl)-amino]-ethanol, tris-(2-hydroxyethyl)-amine, N-aminoethyl-N'-hydroxyethylethylenediamine, N,N'-dihydroxyethyl-ethylenediamine, 2-[2-(2-aminoethoxy)-ethylamino]

ethanol, 2-[2-(2-aminoethylamino)-ethoxy]-ethanol, 2-[2-(2-aminoethoxy)-ethoxy]-ethanol, tertiary-butyldiethanolamine, 3-amino-1-propanol, isobutanolamine, 2-(2-aminoethoxy)-propanol and mixtures thereof;
(C) one or more sulfonic acids selected from the group consisting of methane sulfonic acid, ethanesulfonic acid, propanesulfonic acid, butanesulfonic acid, hexanesulfonic acid, 3-(N-morpholino)propane sulfonic acid, 2-(N-morpholino)ethanesulfonic acid, N-cyclohexyl-2-aminoethanesulfonic acid, 3-[4-(2-hydroxyethyl)-1-piperazinyl]propanesulfonic acid, N-cyclohexyl-3-aminopropanesulfonic acid and mixtures thereof,
wherein a total amount of the one or more sulfonic acids (C) is in a range of from 0.01 to 10 wt.-%, based on the total weight of the cleaning composition;
(D) one or more corrosion inhibitors selected from the group consisting of benzotriazole, 5-methyl-benzotriazole, 1,2,4-triazole, 5-aminotetrazole, 1-hydroxybenzotriazole, 5-amino-1,3,4-thiadiazol-2-thiol, 3-amino-1H-1,2,4 triazole, 3,5-diamino-1,2,4-triazole, tolyltriazole, 5-phenyl-benzotriazole, 5-nitro-benzotriazole, 3-amino-5-mercapto-1,2,4-triazole, 1-amino-1, 2,4-triazole, 2-(5-amino-pentyl)-benzotriazole, 1-amino-1,2,3-triazole, 1-amino-5-methyl-1,2,3-triazole, 3-mercapto-1,2,4-triazole, 3-isopropyl-1,2,4-triazole, 5-phenylthiol-benzotriazole, halobenzotriazoles where halo is selected from the group consisting of fluorine, chlorine, bromine and iodine, naphthotriazole, 1 H-tetrazole-5-acetic acid, 2-mercaptobenzothiazole, 1-phenyl-2-tetrazoline-5-thione, 2-mercaptobenzimidazole, 4-methyl-2-phenylimidazole, 2-mercaptothiazoline, 2,4-diamino-6-methyl-1,3,5-triazine, thiazole, imidazole, benzimidazole, triazine, methyltetrazole, 1,3-dimethyl-2-imidazolidinone, 1,5-pentamethylenetetrazole, 1-phenyl-5-mercaptotetrazole, 2H-imidazole-2-thione, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, 2,2'-azanediyldiacetic acid, propanethiol, ascorbic acid, thiourea, ethylene urea, ethylene thiourea, 1,1,3,3-tetramethylurea, urea, uric acid, glycine, dodecylphosphonic acid, oxalic acid, malonic acid, succinic acid, nitrilotriacetic acid and mixtures thereof;
(E) citric acid,
wherein a total amount of the citric acid (E) is in a range of from 0.1 to 25 wt.-%, based on the total weight of the cleaning composition;
and
(F) water.

7. The cleaning composition of claim 1, consisting of:
(A) ammonium fluoride,
(B) tris-(2-hydroxyethyl)-amine,
(C) methane sulfonic acid,
(D) glycine,
(E) citric acid, and
(F) water.

8. A process of manufacturing a semiconductor device from a semiconductor substrate, the process comprising removing post-etch or post ash residue from a substrate by contacting the substrate at least once with the cleaning composition of claim 1.

9. The process of claim 8, wherein
the semiconductor substrate comprises a layer of copper and/or an oxide of copper and/or a copper hydroxide compound and/or a low k material,
and/or
in the removing, the post-etch or post ash residue comprises one or more residues selected from the group consisting of:
organic compounds,
metal(-organic) complexes, and
metallic materials.

10. The process of claim 8, comprising etching one or more substrate layers, wherein
the removing is performed after the etching,
and/or
the removing comprises the removal of one or more oxides or hydroxides of copper and/or the removal of organic compounds.

11. A process of removing post-etch or post ash residue from a substrate comprising a low k material and/or a copper material, the process comprising contacting the post-etch or post ash residue with the cleaning composition of claim 1,
wherein the post-etch or post ash residue comprises one or more residues selected from the group consisting of:
organic compounds,
metal(-organic) complexes, and
metallic materials.

12. A process of removing post-etch or post ash residue from a surface of a semiconductor substrate comprising a low k material and/or copper, the process comprising contacting the post-etch or post ash residue with the cleaning composition of claim 1,
optionally wherein the post-etch or post ash residue comprises one or more residues selected from the group consisting of:
organic compounds,
metal(-organic) complexes, and
metallic materials.

13. The process of claim 12, wherein the post-etch or post ash residue comprises one or more residues selected from the group consisting of:
organic compounds,
metal(-organic) complexes, and
metallic materials.

14. A process of cleaning a semiconductor substrate comprising a low k material and/or copper, the process comprising contacting the semiconductor substrate with the cleaning composition of claim 1,
optionally after etching one or more substrate layers, wherein the one or more substrate layers are optionally selected from the group consisting of a photoresist layer, a bottom anti-reflective coating layer, an etch mask layer, an inter-layer dielectric layer and a low k material layer.

15. A process of removing residues and contaminants from a surface of a semiconductor substrate comprising a low k material and/or copper, the process comprising contacting the semiconductor substrate with the cleaning composition of claim 1,
optionally wherein the residues and contaminants are selected from the group consisting of:
organic compounds, optionally comprising fluorine
metal(-organic) complexes, and
metallic materials.

* * * * *